United States Patent
Yang et al.

(10) Patent No.: US 11,774,821 B2
(45) Date of Patent: Oct. 3, 2023

(54) DISPLAY PANEL AND MANUFACTURING METHOD THEREOF

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Ni Yang, Beijing (CN); Wu Wang, Beijing (CN); Guanglan Xu, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/790,238

(22) PCT Filed: May 17, 2021

(86) PCT No.: PCT/CN2021/094100
§ 371 (c)(1),
(2) Date: Jun. 30, 2022

(87) PCT Pub. No.: WO2022/001422
PCT Pub. Date: Jan. 6, 2022

(65) Prior Publication Data
US 2023/0060342 A1    Mar. 2, 2023

(30) Foreign Application Priority Data

Jun. 30, 2020  (CN) .......................... 202010617911.4

(51) Int. Cl.
G02F 1/1368 (2006.01)
G02F 1/1362 (2006.01)
G09G 3/36 (2006.01)

(52) U.S. Cl.
CPC ...... *G02F 1/1368* (2013.01); *G02F 1/136209* (2013.01); *G02F 1/136286* (2013.01); *G09G 3/3677* (2013.01)

(58) Field of Classification Search
CPC .................................................... G02F 1/1368
See application file for complete search history.

(56) References Cited

U.S. PATENT DOCUMENTS 9,261,741 B2    2/2016  Yoshida et al.
9,304,346 B2    4/2016  Ichimura et al.
(Continued)

FOREIGN PATENT DOCUMENTS

CN    102640042 A    8/2012
CN    104851902 A    8/2013
(Continued)

OTHER PUBLICATIONS

Office Action from Chinese application 202010617911.4 dated Apr. 18, 2022.

*Primary Examiner* — Sang V Nguyen
(74) *Attorney, Agent, or Firm* — Dilworth & Barrese, LLP.; Michael J. Musella, Esq.

(57)    ABSTRACT

A display panel and a manufacturing method thereof are disclosed. The display panel has a display area and a peripheral area, including: an array substrate, an opposite substrate, and a sealant layer including a first edge close to the display area and a second edge away from the display area. The array substrate includes a base substrate, a driving circuit and an organic insulating layer including a first part and a second part. In a direction perpendicular to a substrate surface, the first part overlaps with the sealant layer, and the (Continued)

second part has no overlap. In a direction parallel to the substrate surface, an edge of the first part away from the display area is between the first edge and the second edge. The driving circuit includes a gate scan driving circuit at least partially overlapped with the first part in the direction perpendicular to the substrate surface.

16 Claims, 8 Drawing Sheets

(56) References Cited

U.S. PATENT DOCUMENTS

| | | | |
|---|---|---|---|
| 9,366,914 | B2 | 6/2016 | Chen et al. |
| 9,817,276 | B2 | 11/2017 | Sakamoto et al. |
| 10,222,657 | B2 | 3/2019 | Shibano et al. |
| 10,593,738 | B2 | 3/2020 | Kim |
| 10,754,203 | B2 | 8/2020 | Tanaka et al. |
| 11,018,317 | B2 | 5/2021 | Hong et al. |
| 11,169,420 | B1 | 11/2021 | Liao et al. |
| 2003/0112387 | A1* | 6/2003 | Lim ............... G02F 1/1339 349/110 |
| 2003/0122983 | A1 | 7/2003 | Kim et al. |
| 2007/0164675 | A1* | 7/2007 | Amano ............ H05B 33/04 313/512 |
| 2019/0333977 | A1* | 10/2019 | Lo ............. G09G 3/3266 |
| 2021/0333595 | A1 | 10/2021 | Jiang |

FOREIGN PATENT DOCUMENTS

| | | |
|---|---|---|
| CN | 103323994 A | 9/2013 |
| CN | 103477275 A | 12/2013 |
| CN | 203337943 U | 12/2013 |
| CN | 103698954 A | 4/2014 |
| CN | 107121856 A | 9/2017 |
| CN | 108919579 A | 11/2018 |
| CN | 109313370 A | 2/2019 |
| CN | 109411509 A | 3/2019 |
| CN | 110824785 A | 2/2020 |
| CN | 110928009 A | 3/2020 |
| CN | 111077702 A | 4/2020 |
| JP | H9-33933 A | 2/1997 |
| JP | 2003-121860 A | 4/2003 |
| JP | 2009-128678 A | 6/2009 |
| JP | 2009128678 * 6/2009 ........... G02F 1/1368 |
| WO | 2015/170700 A1 | 11/2015 |

* cited by examiner

DISPLAY PANEL AND MANUFACTURING METHOD THEREOF

The present application claims priority of China Patent application No. 202010617911.4 filed on Jun. 30, 2020, the content of which is incorporated in its entirety as portion of the present application by reference herein, for all purposes.

TECHNICAL FIELD

Embodiments of the present disclosure relate to a display panel and a manufacturing method thereof.

BACKGROUND

Liquid Crystal Display (LCD) panel usually includes an array substrate, an opposite substrate, and a sealant between the array substrate and the opposite substrate to seal the array substrate and the opposite substrate. Liquid crystal materials are filled between the array substrate and the opposite substrate and in an area sealed by the sealant. Driven by an electric field, an alignment direction of molecules in the liquid crystal materials can be changed, thus realizing a change of light transmittance of the display panel.

At present, the display panel is developing towards larger screen and full screen, and how to realize a narrow bezel of the LCD panel is the focus of attention in this field.

SUMMARY

At least one embodiment of the present disclosure provides a display panel having a display area and a peripheral area surrounding the display area. The display panel includes an array substrate, an opposite substrate and a sealant layer between the array substrate and the opposite substrate to seal a periphery of the array substrate and a periphery of the opposite substrate; the sealant layer is arranged in the peripheral area, and the sealant layer has a first edge close to the display area and a second edge away from the display area; the array substrate includes a base substrate, a driving circuit arranged on the base substrate, and an organic insulating layer arranged at a side of the driving circuit away from the base substrate; the organic insulating layer includes a first part and a second part, the first part overlaps with the sealant layer in a direction perpendicular to a substrate surface of the base substrate, the second part has no overlap with the sealant layer, and an edge of the first part away from the display area is located between the first edge and the second edge in a direction parallel to the substrate surface of the base substrate; the driving circuit includes a gate scan driving circuit arranged in the peripheral area, and the gate scan driving circuit at least partially overlaps with the first part in the direction perpendicular to the substrate surface of the base substrate.

For example, in the display panel provided by at least one embodiment of the present disclosure, in the direction parallel to the substrate surface of the base substrate, a distance between the edge of the first part away from the display area and the first edge is smaller than a distance between the edge of the first part away from the display area and the second edge.

For example, in the display panel provided by at least one embodiment of the present disclosure, an average thickness of the first part is less than or equal to an average thickness of the second part in the direction perpendicular to the substrate surface of the base substrate.

For example, in the display panel provided by at least one embodiment of the present disclosure, the gate scan driving circuit includes a plurality of active devices, and orthographic projections of the plurality of active devices on a plane of the organic insulating layer is located inside the organic insulating layer.

For example, in the display panel provided by at least one embodiment of the present disclosure, the first part and the second part are continuously arranged, and edges of cross sections of the first part and the second part away from the base substrate are in a stepped shape.

For example, in the display panel provided by at least one embodiment of the present disclosure, in the direction perpendicular to the substrate surface of the base substrate, the first part includes an organic insulating pattern overlapped with the plurality of active devices of the gate scan driving circuit and a hollow portion having no overlap with the plurality of active devices of the gate scan driving circuit.

For example, in the display panel provided by at least one embodiment of the present disclosure, the organic insulating pattern overlapped with the plurality of active devices of the gate scan driving circuit includes a plurality of portions spaced apart from each other; and the plurality of portions overlap with the plurality of active devices, in a one-to-one correspondence, in the direction perpendicular to the substrate surface of the base substrate.

For example, in the display panel provided by at least one embodiment of the present disclosure, the plurality of active devices include a plurality of thin film transistors, and the plurality of thin film transistors include a plurality of active layers, and orthographic projections of the plurality of active layers on the base substrate are located within orthographic projections of the plurality of portions on the base substrate.

For example, in the display panel provided by at least one embodiment of the present disclosure, the array substrate further includes a plurality of signal lines arranged at a side of the gate scan driving circuit away from the display area; in the direction perpendicular to the substrate surface of the base substrate, the plurality of signal lines have no overlap with the organic insulating layer, and the plurality of signal lines overlap with the sealant layer.

For example, in the display panel provided by at least one embodiment of the present disclosure, the driving circuit further includes a pixel driving circuit arranged in the display area, the pixel driving circuit includes a first thin film transistor, the first thin film transistor includes a first gate electrode, a first active layer and a first source-drain electrode; the plurality of thin film transistors include a second thin film transistor, and the second thin film transistor includes a second gate electrode, a second active layer and a second source-drain electrode; the first gate electrode and the second gate electrode are arranged in a same layer, the first active layer and the second active layer are arranged in a same layer, and the first source-drain electrode and the second source-drain electrode are arranged in a same layer.

For example, in the display panel provided by at least one embodiment of the present disclosure, the plurality of signal lines are respectively arranged in the same layer as first gate electrode and the second gate electrode.

For example, in the display panel provided by at least one embodiment of the present disclosure, the array substrate further includes a first planarization layer arranged at a side of the pixel driving circuit away from the base substrate, and the organic insulating layer includes the first planarization layer.

For example, in the display panel provided by at least one embodiment of the present disclosure, the array substrate further includes a first driving electrode arranged at a side of the first planarization layer away from the base substrate and a second planarization layer arranged at a side of the first driving electrode away from the base substrate, and the organic insulating layer further includes the second planarization layer.

For example, in the display panel provided by at least one embodiment of the present disclosure, the display panel further includes a second driving electrode arranged on the array substrate, and the second driving electrode is arranged in the same layer with the first driving electrode and is spaced apart from the first driving electrode, or, the second driving electrode is arranged in a different layer from that of the first driving electrode and is spaced apart from the first driving electrode; or the second driving electrode is arranged on the opposite substrate.

For example, in the display panel provided by at least one embodiment of the present disclosure, the array substrate further includes a passivation layer arranged between the driving circuit and the organic insulating layer, and the opposite substrate further includes a black matrix layer including a plurality of pixel openings, and the sealant layer is in direct contact with the black matrix layer and the passivation layer.

For example, in the display panel provided by at least one embodiment of the present disclosure, a distance between the first edge and the second edge is 0.1 mm to 1.5 mm.

For example, the display panel provided by at least one embodiment of the present disclosure further includes a liquid crystal layer arranged between the array substrate and the opposite substrate.

At least one embodiment of the present disclosure further provides a method of manufacturing a display panel having a display area and a peripheral area surrounding the display area, the method includes: providing an array substrate, wherein the array substrate includes a base substrate, a driving circuit arranged on the base substrate, and an organic insulating layer arranged at a side of the driving circuit away from the base substrate, and wherein the organic insulating layer includes a first part and a second part; providing an opposite substrate; and forming a sealant layer between the array substrate and the opposite substrate to bond the array substrate with the opposite substrate, wherein the sealant layer is formed in the peripheral area, and the sealant layer has a first edge close to the display area and a second edge away from the display area; in a direction perpendicular to a substrate surface of the base substrate, the first part overlaps with the sealant layer, and the second part has no overlap with the sealant layer; and in a direction parallel to the substrate surface of the base substrate, an edge of the first part away from the display area is located between the first edge and the second edge; and the driving circuit includes a gate scan driving circuit arranged in the peripheral area, and the gate scan driving circuit at least partially overlaps with the first part in the direction perpendicular to the substrate surface of the base substrate.

For example, in the method provided by at least one embodiment of the present disclosure, in the direction perpendicular to the substrate surface of the base substrate, an average thickness of the first part is smaller than an average thickness of the second part wherein forming the first part and the second part includes: forming the first part and the second part by using a gray mask, wherein the gray mask includes a first mask portion corresponding to the first part and a second mask portion corresponding to the second part, and a light transmittance of the first mask portion is different from that of the second mask portion.

For example, in the method provided by at least one embodiment of the present disclosure, in the direction perpendicular to the substrate surface of the base substrate, an average thickness of the first part is smaller than an average thickness of the second part, and the first part includes an organic insulating pattern overlapped with a plurality of active devices of the gate scan driving circuit and a hollow portion having no overlap with the plurality of active devices of the gate scan driving circuit, wherein forming the first part and the second part includes: forming the first part and the second part by using a gray mask, wherein the gray mask includes a first mask portion corresponding to the organic insulating pattern of the first part, a second mask portion corresponding to the hollow portion of the first part, and a third mask portion corresponding to the second part, and light transmittances of the first mask portion, the second mask portion and the third mask portion are different from each other.

For example, in the method provided by at least one embodiment of the present disclosure, in the direction perpendicular to the substrate surface of the base substrate, an average thickness of the first part is smaller than an average thickness of the second part, and the first part includes an organic insulating pattern overlapped with a plurality of active devices of the gate scan driving circuit and a hollow portion having no overlap with the plurality of active devices of the gate scan driving circuit, wherein forming the first part and the second part includes: forming the first part and the second part by using a slit mask, wherein the slit mask comprises a slit portion corresponding to the organic insulating pattern of the first part, a first mask portion corresponding to the hollow portion of the first part and a second mask portion corresponding to the second part, and one of the first mask portion and the second mask portion is light transmissive and the other is light opaque.

BRIEF DESCRIPTION OF THE DRAWINGS

In order to clearly illustrate the technical solutions of the embodiments of the present disclosure, the drawings of the embodiments will be briefly described in the following. Apparently, the described drawings merely are related to a part of embodiments of the present disclosure without limiting the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Figure 1:
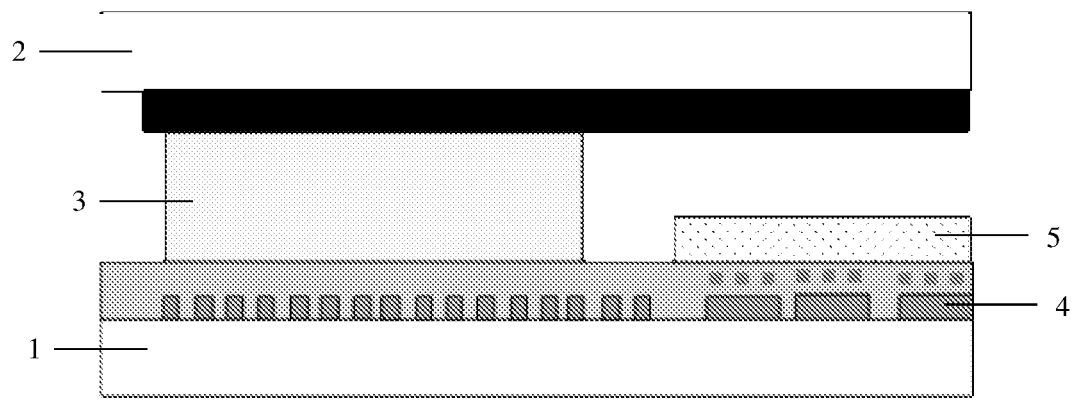
FIG. 1 is a schematic cross-sectional view of a display panel.

FIG. 1 shows a schematic cross-sectional view of a display panel. As shown in FIG. 1, the display panel includes an array substrate 1, an opposite substrate 2, and a sealant 3 between the array substrate 1 and the opposite substrate 2 to seal the array substrate 1 and the opposite substrate 2. The display panel has a display area and a peripheral area surrounding the display area, and the sealant 3 is arranged in the peripheral area to protect the display area to prevent from affecting a display effect of the display area.

When the area of the peripheral area of the display panel is larger, as shown in FIG. 1, the peripheral area has enough space to allow for the arrangement of the sealant 2 and a peripheral circuit 4. At this time, the sealant 3 will not cover the peripheral circuit 4 (the peripheral circuit 4 is electrically connected with a driving circuit of the display area, for example, so as to control the display effect of the display area), and a protective insulating layer 5 that covers on the peripheral circuit 4 is arranged in a different area from that of the sealant 3 and has no overlap with the sealant 3.

Figure 2:
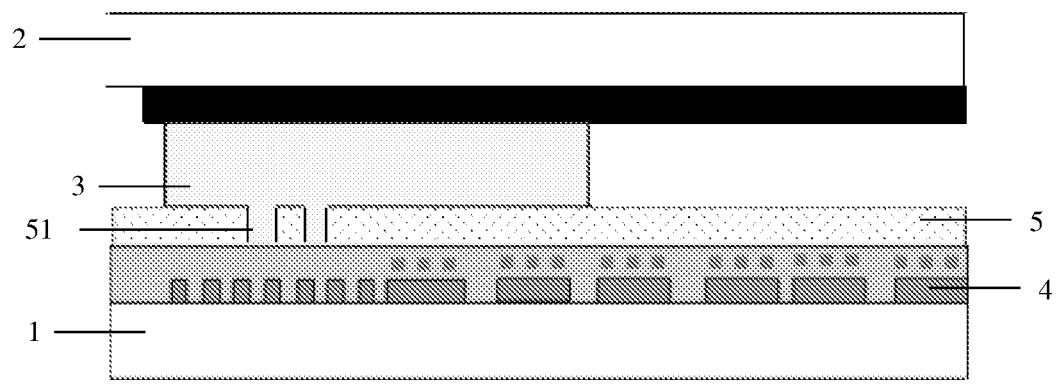
FIG. 2 is a schematic cross-sectional view of another display panel.

However, when the display panel is designed with a narrow bezel, the area of the peripheral area is limited. At this time, as shown in FIG. 2, the sealant 2 may cover the peripheral circuit 4. In order not to affect the original installation environment of the peripheral circuit 4, as shown in FIG. 2, the protective insulating layer 5 provided on the peripheral circuit 4 will overlap with the sealant 2 or even extend beyond the sealant 2, and hence be exposed by the sealant 2. At this time, impurities such as water and oxygen can easily invade through the protective insulating layer 5. In some embodiments, a groove 51 can be formed in the protective insulating layer 5 to block the intrusion path of impurities such as water and oxygen. However, experiments have proved that the blocking effect to impurities such as water and oxygen by such method is not quite ideal, and impurities such as water and oxygen will still invade along other portions of the protective insulating layer 5 so as to corrode the peripheral circuit 4 and even extend to the display area to corrode the driving circuit of the display area, thus affecting the display effect of the display area.

At least one embodiment of the present disclosure provides a display panel and a manufacturing method thereof. The display panel has a display area and a peripheral area surrounding the display area, and includes an array substrate, an opposite substrate, and a sealant layer between the array substrate and the opposite substrate to seal a periphery of the array substrate and a periphery of the opposite substrate. The sealant layer is arranged in the peripheral area, and has a first edge close to the display area and a second edge away from the display area. The array substrate includes a base substrate, a driving circuit arranged on the base substrate, and an organic insulating layer arranged at a side of the driving circuit away from the base substrate; the organic insulating layer includes a first part and a second part; in a direction perpendicular to a substrate surface of the base substrate, the first part overlaps with the sealant layer, the second part has no overlap with the sealant layer; an edge of the first part away from the display area is located between the first edge and the second edge in a direction parallel to the substrate surface of the base substrate; the driving circuit includes a gate scan driving circuit arranged in the peripheral area, and the gate scan driving circuit at least partially overlaps with the first part in the direction perpendicular to the substrate surface of the base substrate. The display panel has a better sealing effect and can realize a narrow bezel.

The display panel and the manufacturing method thereof of the present disclosure are described by way of example through the following specific embodiments.

Figure 3:
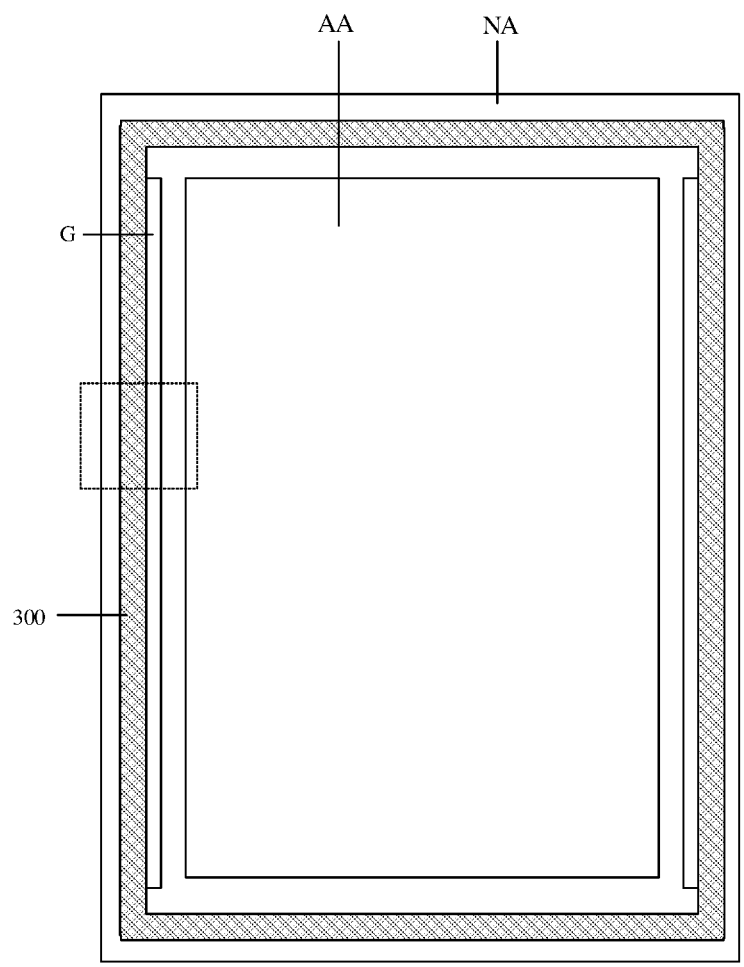
FIG. 3 is a schematic plan view of a display panel provided by at least one embodiment of the present disclosure.
Figure 4:
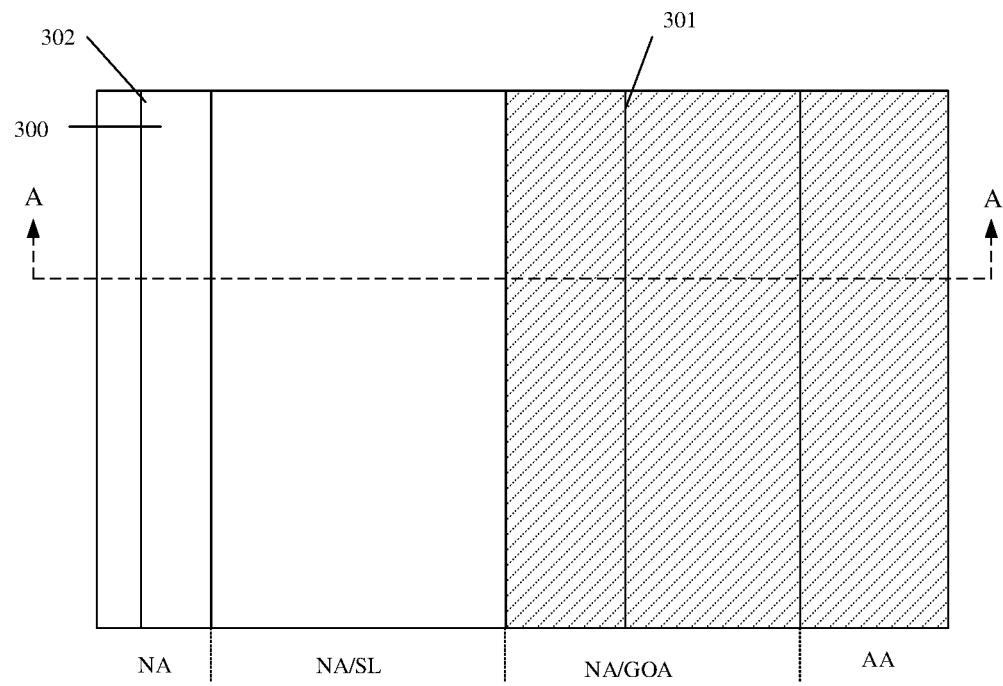
FIG. 4 is a schematic enlarged view of an area of the display panel in FIG. 3 indicated by a dashed box.
Figure 5:
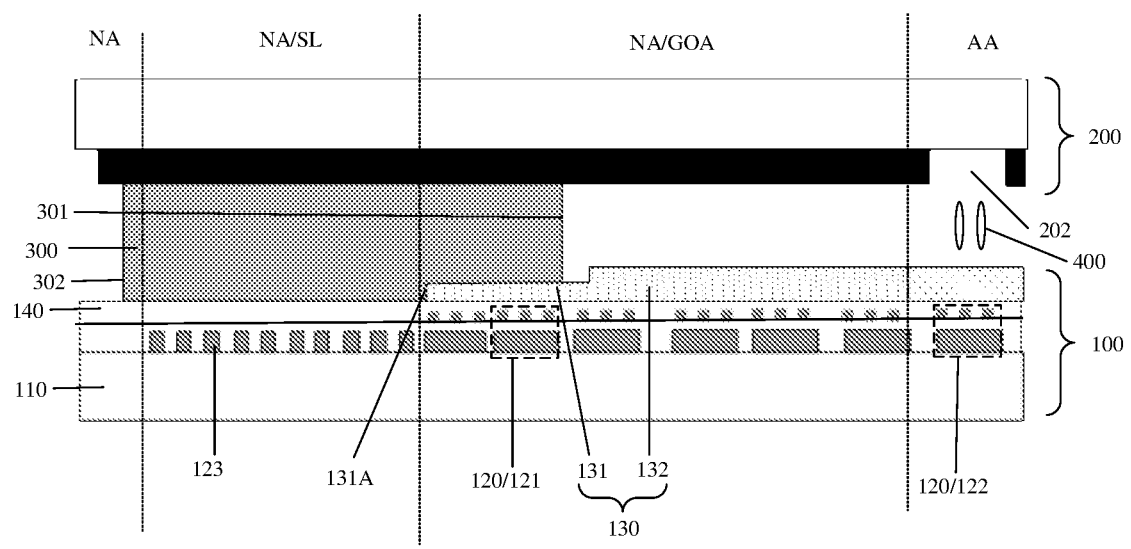
FIG. 5 is a schematic cross-sectional view of the display panel in FIG. 4 taken along line A-A.

At least one embodiment of the present disclosure provides a display panel, and FIG. 3 shows a schematic plan view of the display panel, FIG. 4 shows a schematic enlarged view of a part of the display panel in FIG. 3 indicated by a dashed box, and FIG. 5 shows a schematic cross-sectional view of the display panel in FIG. 4 taken along line A-A.

As shown in FIG. 3, the display panel has a display area AA and a peripheral area NA surrounding the display area AA. In order to realize a narrow bezel of the display panel, it is necessary to minimize the area occupied by the peripheral area NA.

As shown in FIGS. 3-5, the display panel includes an array substrate 100, an opposite substrate 200, and a sealant layer 300 between the array substrate 100 and the opposite substrate 200 to seal a periphery of the array substrate 100 and a periphery of the opposite substrate 200. The sealant layer 300 is arranged in the peripheral area NA and surrounds the display area AA so as to seal and protect the display area AA and avoid adverse effects on the display effect of the display area AA.

As shown in FIGS. 4 and 5, the sealant layer 300 has a first edge 301 close to the display area AA and a second edge 302 away from the display area AA. The array substrate 100 includes a base substrate 110, a driving circuit 120 arranged on the base substrate 110, and an organic insulating layer 130 arranged at a side of the driving circuit 120 away from the base substrate 110. The organic insulating layer 130 can planarize and protect the driving circuit 120.

For example, as shown in FIG. 5, the organic insulating layer 130 includes a first part 131 and a second part 132. The first part 131 overlaps with the sealant layer 300 in a direction perpendicular to the substrate surface of the base substrate 110, i.e., the vertical direction in the figure; and the second part 132 has no overlap with the sealant layer 300; and in a direction parallel to the substrate surface of the base substrate, i.e., the horizontal direction in the figure, an edge 131A of the first part 131 away from the display area AA is located between the first edge 301 and the second edge 302. Therefore, the sealant layer 300 completely covers the edge 131A of the first part 131 without exposing the first part 131, so as to prevent impurities such as water and oxygen from contacting the organic insulating material of the first part 131, and further prevent impurities such as water and oxygen from invading the display panel along the organic insulating material of the first part 131, thereby improving the sealing effect of the display panel.

For example, as shown in FIG. 3, the driving circuit 120 includes a gate scan driving circuit (GOA) G arranged in the peripheral area NA, and the area where the gate scan driving circuit G is arranged is designated as the gate scan driving circuit area GOA in FIGS. 4 and 5. The display area AA has a plurality of sub-pixels arranged in an array. The gate scan driving circuit G includes, for example, a plurality of cascaded scan driving shift register units, for example, an output end of each scan driving shift register unit is electrically connected with a plurality of sub-pixels in one row to provide a gate scanning signal to the plurality of sub-pixels arranged in an array in the display area AA, for example, a gate scanning signal which is shifted line by line.

For example, in the direction perpendicular to the substrate surface of the base substrate 100, the gate scan driving circuit G at least partially overlaps with the first part 131 of the organic insulating layer 130. Therefore, the first part 131 of the organic insulating layer 130 can protect the gate scan driving circuit G under the sealant layer 300, and maintain the environment of the gate scan driving circuit G under the sealant layer 300 to be basically the same as that of the gate scan driving circuit G covered by the second part 132 of the organic insulating layer 130, thus ensuring that the gate scan driving circuits G located in different positions have basically the same electrical characteristics.

For example, in some embodiments, in the direction parallel to the substrate surface of the base substrate 110, a distance between the edge 131A of the first part 131 away from the display area AA and the first edge 301 is smaller than a distance between the edge 131A of the first part 131 away from the display area AA and the second edge 302. That is, the edge 131A of the first part 131 away from the display area AA does not exceed half the width of the sealant layer 300, thus increasing the distance between the organic insulating layer 130 and the external environment. At this time, the sealant layer 300 can effectively prevent impurities such as water and oxygen from entering the organic insulating layer 130.

For example, in some embodiments, a distance between the first edge 131 and the second edge 132 is 0.1 mm to 1.5 mm, that is, the width of the sealant layer 300 is 0.1 mm to 1.5 mm, such as 0.5 micron or 1 micron, to ensure the sealing effect of the sealant layer 300.

For example, in some embodiments, in the direction perpendicular to the substrate surface of the base substrate 110, an average thickness of the first part 131 is equal to an average thickness of the second part 132; alternatively, as shown in FIG. 5, the average thickness of the first part 131 is smaller than that of the second part 132. Therefore, the extending path of impurities such as water and oxygen can be reduced, and the overall thickness of the display panel can be reduced, thus realizing the thinning of the display panel.

For example, in some embodiments, the average thickness of the first part 131 is greater than 0 and less than 3 microns, such as 1 micron, 1.5 microns or 2 microns, and the average thickness of the second part 132 is greater than 0 and less than or equal to 3 microns, such as 2 microns, 2.5 microns or 3 microns.

It should be noted that, in the embodiment of the present disclosure, the average thickness of a structural layer refers to an average value of distances from various points on the surface of the structural layer away from the base substrate 110 to the surface close to the base substrate 110 in the direction perpendicular to the substrate surface of the base substrate 110.

For example, as shown in FIG. 5, the gate scan driving circuit G includes a plurality of cascaded scan driving shift register units, and each scan driving shift register unit includes a plurality of active devices 121. For example, the plurality of active devices include a plurality of thin film transistors, and may also include other devices such as capacitors and wires. The embodiment of the present disclosure is not limited to the specific configuration (e.g., the structure, number, arrangement and the like of the devices as used) of the scan driving shift register units included in the gate scan driving circuit G, as long as the plurality of scan driving shift register units are cascaded to form the gate scan driving circuit G.

For example, orthographic projections of the plurality of active devices 131 on a plane of the organic insulating layer 130 is located inside the organic insulating layer 130. Therefore, the organic insulating layer 130 completely covers the gate scan driving circuit G to protect the gate scan driving circuit G, and ensures that the gate scan driving circuits G located in different positions have basically the same arrangement environment and hence have basically the same electrical characteristics.

For example, in some embodiments, as shown in FIG. 5, the first part 131 and the second part 132 of the organic insulating layer 130 are continuously arranged, and the edges of the cross sections of the first part 131 and the second part 132 away from the base substrate 110 are in a stepped shape. Therefore, the gate scan driving circuit G is completely covered by the organic insulating layer 130 thereon, so as to further ensure that the gate scan driving circuits G located in different positions have basically the same arrangement environment and hence have basically the same electrical characteristics.

Figure 6A:
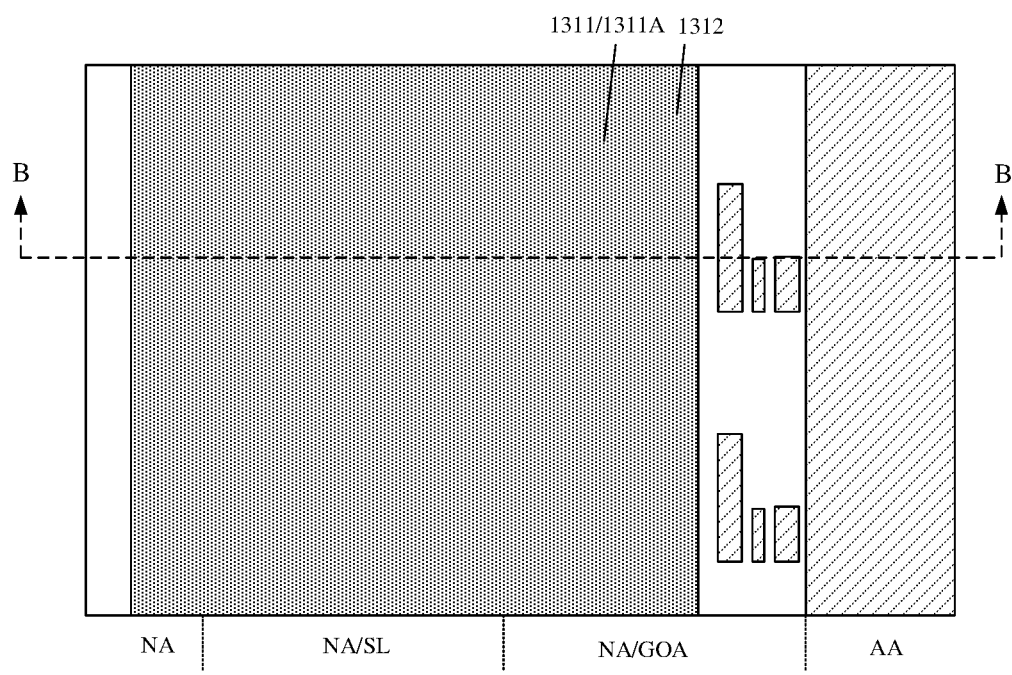
FIG. 6A is another schematic enlarged view of an area of the display panel in FIG. 3 indicated by the dashed box.
Figure 7:
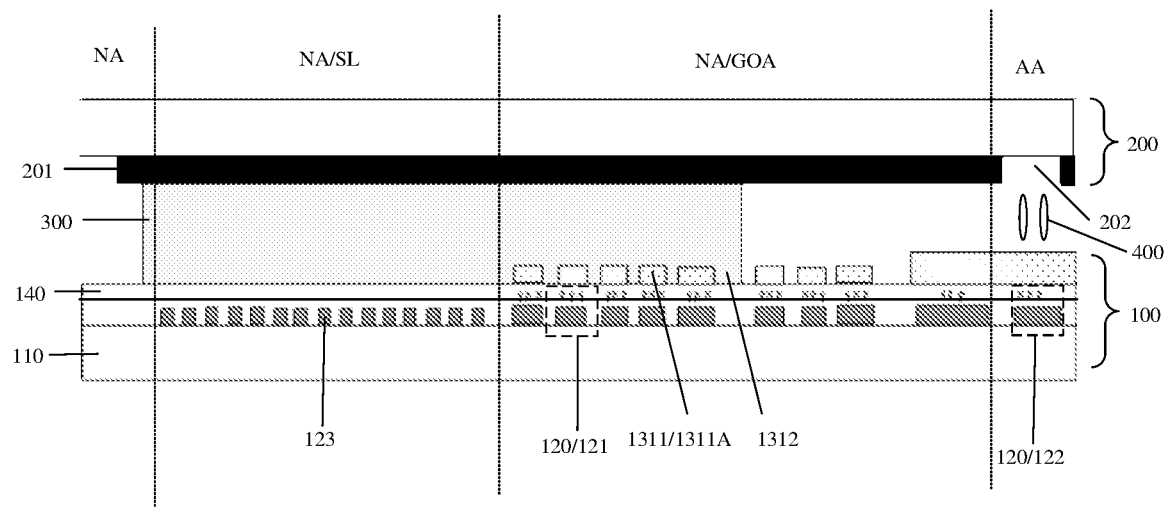
FIG. 7 is a schematic cross-sectional view of the display panel in FIG. 6A taken along line B-B.

For example, in some other embodiments, as shown in FIGS. 6A and 7, in the direction perpendicular to the substrate surface of the base substrate 110, the first part 131 of the organic insulating layer 130 includes an organic insulating pattern 1311 overlapped with the plurality of active devices 121 of the gate scan driving circuit G and a hollow portion 1312 having no overlap with the plurality of active devices 121 of the gate scan driving circuit G. Therefore, only the plurality of active devices 121 of the gate scan driving circuit G are covered by the organic insulating layer 130 thereon, so as to ensure that the plurality of active devices 121 located at different positions have basically the same arrangement environment and hence have basically the same electrical characteristics; furthermore, the area covered by the first part 131 of the organic insulating layer 130 is decreased, and the extending path of impurities such as water and oxygen is further reduced.

Figure 6B:
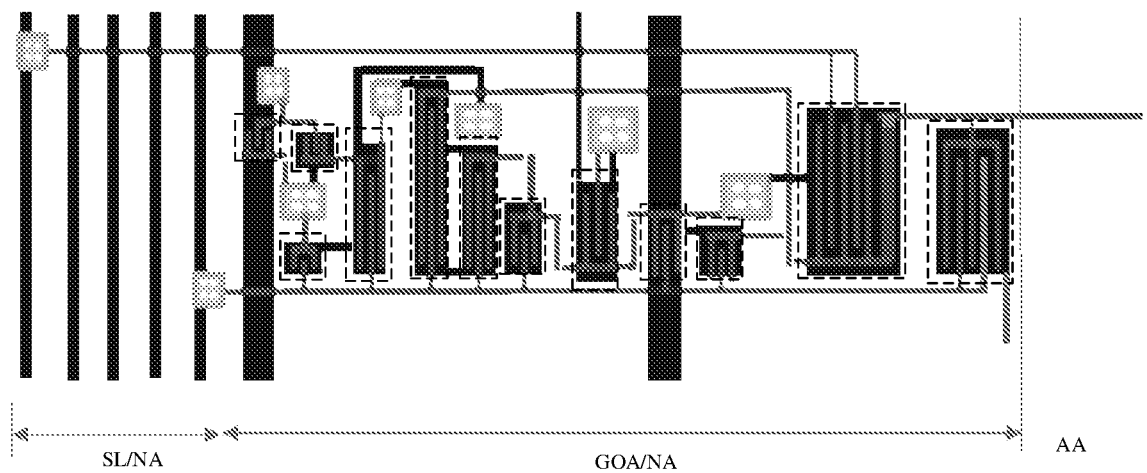
FIG. 6B is yet another schematic enlarged view of an area of the display panel in FIG. 3 indicated by the dashed box.

For example, in some embodiments, FIG. 6B shows a schematic circuit diagram of the gate scan driving circuit G, in which the areas indicated by the plurality of dashed boxes are the areas where the plurality of active devices 121 are arranged.

For example, as shown in FIGS. 6A and 7, the organic insulating pattern 1311 overlapped with the plurality of active devices 121 of the gate scan driving circuit G includes a plurality of portions 1311A spaced apart from each other, and the plurality of portions 1311A overlap with the plurality of active devices 121 in the direction perpendicular to the substrate surface of the base substrate 110. For example, one active device 121 is provided with one or more corresponding portions 1311A to ensure that the plurality of active devices 121 are completely covered by the organic insulating pattern 1311.

Figure 8:
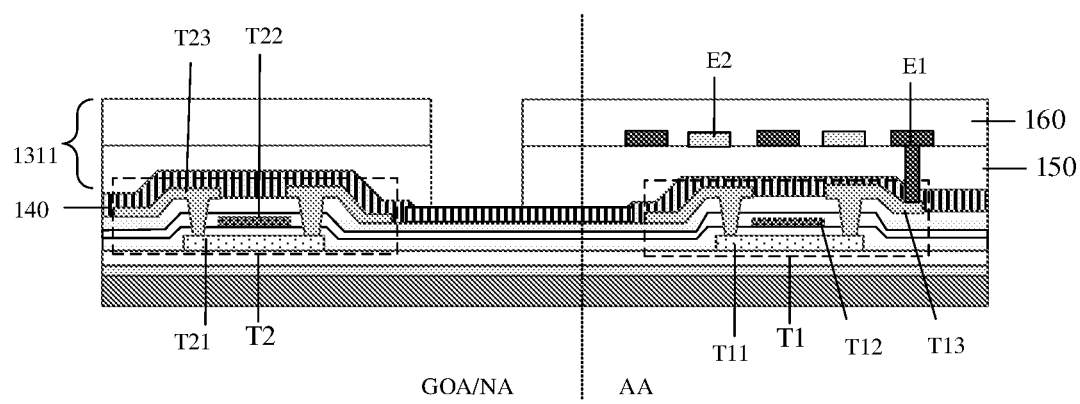
FIG. 8 is a schematic cross-sectional view illustrating a part of a driving circuit of a display panel provided by at least one embodiment of the present disclosure.

For example, in some embodiments, as shown in FIG. 8, the plurality of active devices 121 include a plurality of thin film transistors (one thin film transistor T2 is shown as an example in FIG. 8), and the plurality of thin film transistors include a plurality of active layers (one active layer T21 is shown as an example in FIG. 8), and orthographic projections of the plurality of active layers on the base substrate 110 are located within orthographic projections of the plurality of portions 1311A on the base substrate 110. In the planar arrangement of the plurality of thin film transistors, the range of orthographic projections of the plurality of thin film transistors on the base substrate 110 is similar or basically the same as that of orthographic projections of the plurality of active layers on the base substrate 110. Therefore, the arrangement range of the plurality of portions 1311A can be determined with reference to the arrangement range of the plurality of active layers, so that the plurality of portions 1311A can basically completely cover the plurality of thin film transistors, thereby ensuring that the plurality of thin film transistors located at different positions have basically the same arrangement environment and hence have basically the same electrical characteristics.

Similarly, the embodiment of the present disclosure does not limit the structure of the thin film transistor in the gate scan driving circuit G. For example, the thin film transistor can be a bottom gate type or a top gate type; the active layer of the thin film transistor can adopt various suitable semiconductor materials, for example, polysilicon (such as low-temperature polysilicon or high-temperature polysilicon), amorphous silicon, indium gallium tin oxide (IGZO), etc. The gate electrode, source electrode and drain electrode of the thin film transistor are made of metal materials, such as metal aluminum or aluminum alloy. For example, the active layer of the thin film transistor can have a stripe shape, the source electrode and the drain electrode are located at two ends of the stripe-shaped active layer respectively, and the part between the two ends of the active layer overlaps with the gate electrode to form a channel region. Alternatively, the active layer of the thin film transistor can have a square shape, the gate electrode can also have a square shape and overlaps with the active layer, the source electrode and the drain electrode are located in a same plane, one of the source electrode and the drain electrode is I-shaped and the other one is U-shaped, and the I-shaped electrode is inserted into an opening of the U-shaped electrode.

For example, in some embodiments, as shown in FIGS. 5 and 7, the array substrate 100 further includes a plurality of signal lines 123 arranged at a side of the gate scan driving circuit G away from the display area AA. In FIGS. 4-6A, the area where the plurality of signal lines 123 are arranged is designated as the signal line area SL. For example, in the direction perpendicular to the substrate surface of the base substrate 110, the plurality of signal lines 123 have no overlap with the organic insulating layer 130, and the plurality of signal lines 123 overlap with the sealant layer 300. Therefore, there is no organic insulating layer 130 located above the plurality of signal lines 123, thereby reducing the arrangement range of the organic insulating layer 130 under the sealant layer 300.

For example, as shown in FIGS. 5 and 7, the driving circuit 120 further includes a pixel driving circuit 122 arranged in the display area AA. As shown in FIG. 8, the pixel driving circuit 122 includes a first thin film transistor T1, which includes a first gate electrode T12, a first active layer T11, and a first source-drain electrode T13. The plurality of thin film transistors of the gate scan driving circuit G include a second thin film transistor T2, and the second thin film transistor T2 includes a second gate electrode T22, a second active layer T21, and a second source-drain electrode T23. For example, the first gate electrode T12 and the second gate electrode T22 are arranged in the same layer, the first active layer T11 and the second active layer T21 are arranged in the same layer, and the first source-drain electrode T13 and the second source-drain electrode T23 are arranged in the same layer. In this way, the manufacturing process of the display panel is simplified.

Figure 9:
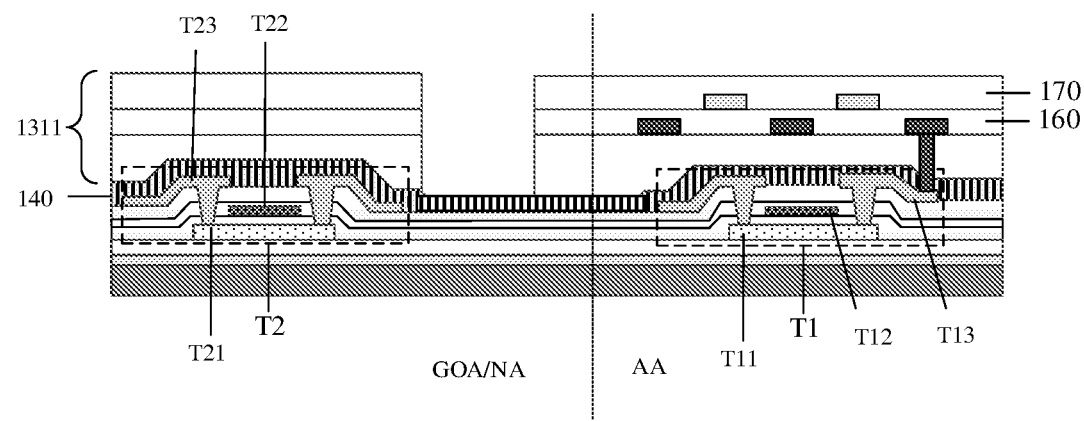
FIG. 9 is schematic cross-sectional view illustrating another part of the driving circuit of the display panel provided by at least one embodiment of the present disclosure.

It should be noted that, in the embodiment of the present disclosure, "arranged in a/the same layer" refers to the case where two functional layers or structural layers are in the same layer of the display substrate in terms of hierarchical structure and are formed of the same material; that is, in the manufacturing process, the two functional layers or structural layers can be formed from the same material layer, and the required patterns and structures can be formed by the same patterning process. Furthermore, the embodiments shown in FIGS. 8 and 9 are explained with reference to the case where the first thin film transistor T1 and the second thin film transistor T2 both are thin film transistors of top gate type, by way of example; in some other embodiments of the present disclosure, the first thin film transistor T1 and the second thin film transistor T2 may also be thin film transistors of bottom gate type, dual-gate type or other types, without particularly limited herein.

For example, the active layers T11 and T21 may be amorphous silicon layers, polysilicon layers or metal oxide semiconductor layers. For example, the polysilicon may be low-temperature polysilicon or high-temperature polysilicon; and the oxide semiconductor may be indium gallium tin oxide (IGZO), indium zinc oxide (IZO), zinc oxide (ZnO) or gallium zinc oxide (GZO). The first gate electrode T12 and the second gate electrode T22 may adopt metal materials or alloy materials such as copper (Cu), aluminum (Al) and titanium (Ti); for example, it may be formed into a single-layered metal layer structure or a multi-layered metal layer structure, e.g., a multi-layered metal layer structure such as titanium/aluminum/titanium. The first source-drain electrode T13 and the second source-drain electrode T23 may adopt metal materials or alloy materials such as copper (Cu), aluminum (Al) and titanium (Ti); for example, it may be formed into a single-layered metal layer structure or a multi-layered metal layer structure, e.g., a multi-layered metal layer structure such as titanium/aluminum/titanium.

For example, the plurality of signal lines 123 are arranged in the same layer as the first gate electrode T12 and the second gate electrode T22, respectively, so as to further simplify the manufacturing process. For example, the plurality of signal lines 123 may be electrically connected to the gate scan driving circuit G to transmit driving signals for the gate scan driving circuit G.

For example, as shown in FIG. 8, the array substrate 100 further includes a first planarization layer 150 arranged at a side of the pixel driving circuit away from the base substrate 110 to planarize and protect the pixel driving circuit. For example, the organic insulating layer 130 includes the first planarization layer 150, that is, the first planarization layer 150 is formed as at least a part of the organic insulating layer 130.

For example, as shown in FIG. 8, the array substrate further includes a first driving electrode E1 arranged at a side of the first planarization layer 150 away from the base substrate 100, and a second planarization layer 160 arranged at a side of the first driving electrode E1 away from the base substrate 110. For example, the organic insulating layer 130 further includes the second planarization layer 160, that is, the second planarization layer 160 is also formed as at least a part of the organic insulating layer 130.

For example, the display panel further includes a second driving electrode E2. In some examples, as shown in FIG. 8, the second driving electrode E2 is arranged on the array substrate 100, and is spaced apart from the first driving electrode E1 in the same layer. Alternatively, in some other examples, as shown in FIG. 9, the second driving electrode E2 is arranged on the array substrate 100, and is spaced apart from the first driving electrode E1 in different layers. At this time, the side of the second driving electrode E2 away from the base substrate 110 is further provided with a third planarization layer 170. For example, the organic insulating layer 130 further includes the third planarization layer 170, that is, the third planarization layer 170 is also formed as at least a part of the organic insulating layer 130. Alternatively, in some other examples, the second driving electrode E2 may also be arranged on the opposite substrate 200. The embodiment of the present disclosure is not limited to the specific arrangement of the first driving electrode E1 and the second driving electrode E2.

For example, organic insulating layers such as the first planarization layer 150, the second planarization layer 160, and the third planarization layer 170 may adopt organic insulating materials such as polyimide or acrylic resin.

For example, as shown in FIGS. 5 and 7, the display panel further includes a liquid crystal layer 400 arranged between the array substrate 100 and the opposite substrate 200, and the liquid crystal layer 400 includes liquid crystal materials which can be deflected differently under the drive of the first driving electrode E1 and the second driving electrode E2, thereby realizing different light transmittances to realize displaying. At this time, the display panel is realized as a liquid crystal display panel.

For example, the array substrate 100 further includes a first polarizer (not shown), which is, for example, arranged at a light incident side of the display light of the array substrate; the opposite substrate 200 further includes a second polarizer (not shown), which is, for example, arranged at a light emitting side of the display light of the opposite substrate 200. For example, a polarization axis of the first polarizer and a polarization axis of the second polarizer are perpendicular to each other, so that the liquid crystal 400 can control the degree of light transmission of the corresponding area with the cooperation of the first polarizer and the second polarizer. For example, for the gray scale range of 0-255, it can realize a gray scale of 0, which is basically opaque to light, or a gray scale of 255, which indicates the maximum degree of light transmission.

For example, as shown in FIGS. 5 and 7-9, the array substrate 100 further includes a passivation layer 140 arranged between the driving circuit 120 and the organic insulating layer 130, and the passivation layer 140 is made of inorganic insulating materials such as silicon oxide, silicon nitride, silicon oxynitride, etc. The opposite substrate 200 further includes a black matrix layer 201, which includes a plurality of pixel openings 202 corresponding to a plurality of sub-pixels in the display area AA respectively. For example, the plurality of pixel openings 202 can be correspondingly provided with filters of different colors, so that when the liquid crystal layer 400 transmits light, different pixel openings 202 can transmit light of different colors, such as red light, green light, blue light, etc., to realize colored display. For example, the sealant layer 300 is in direct contact with the black matrix 201 and the passivation layer 140, respectively, to seal the array substrate 100 and the opposite substrate 200.

It should be noted that, the display panel provided by the embodiments of the present disclosure may also include other functional layers such as a touch layer, an encapsulation layer, etc. These functional layers may refer to conventional technologies and will not be described herein. In addition, the display panel provided by the embodiments of the present disclosure can also be other types of display panels, such as organic light-emitting display panels or quantum dot light-emitting display panels, etc., and the types of the display panels are not specifically limited by the embodiments of the present disclosure.

Figure 10:
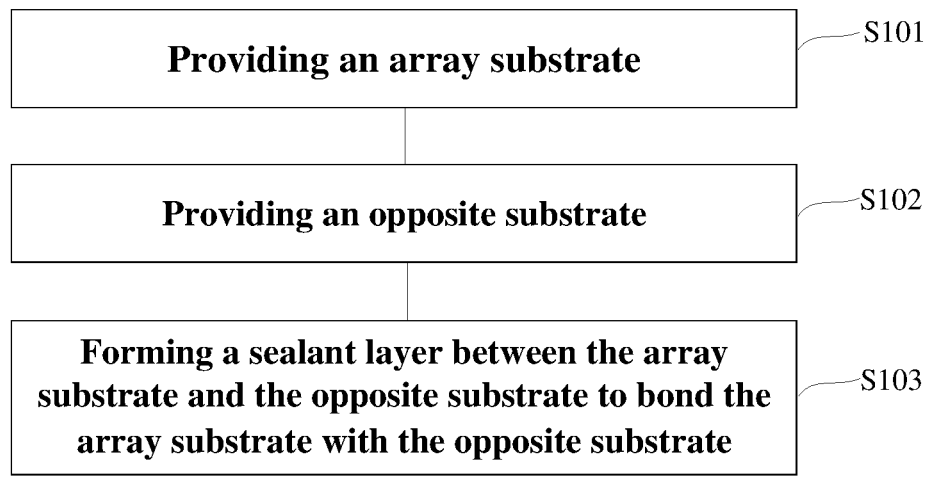
FIG. 10 is a flowchart of a method of manufacturing a display panel provided by at least one embodiment of the present disclosure.

At least one embodiment of the present disclosure also provides a method of manufacturing a display panel having a display area and a peripheral area surrounding the display area. As shown in FIG. 10, the method includes steps S101-S103.

S101: providing an array substrate.

For example, the array substrate includes a base substrate, a driving circuit arranged on the base substrate, and an organic insulating layer arranged at a side of the driving circuit away from the base substrate; the organic insulating layer includes a first part and a second part.

S102, providing an opposite substrate.

The specific structure of the opposite substrate is not limited in the embodiment of the present disclosure, for example, the opposite substrate includes functional layers such as a black matrix layer.

S103: forming a sealant layer between the array substrate and the opposite substrate to bond the array substrate with the opposite substrate.

For example, the sealant layer is formed in the peripheral area, and has a first edge close to the display area and a second edge away from the display area. In the direction perpendicular to the substrate surface of the base substrate, the first part overlaps with the sealant layer, and the second part has no overlap with the sealant layer. In the direction parallel to the substrate surface of the base substrate, the edge of the first part away from the display area is located between the first edge and the second edge. The driving circuit includes a gate scan driving circuit arranged in the peripheral area, and the gate scan driving circuit at least partially overlaps with the first part in the direction perpendicular to the substrate surface of the base substrate.

For example, forming an array substrate includes: forming a driving circuit on a base substrate. The manufacturing process of the driving circuit can refer to related technologies, which will not be repeated herein. Then, forming an organic insulating layer at a side of the driving circuit away from the base substrate. The organic insulating layer includes a first part and a second part.

For example, in some embodiments, as shown in FIGS. 5 and 7, an average thickness of the first part is smaller than that of the second part in the direction perpendicular to the substrate surface of the base substrate. At this time, forming the first part and the second part includes: forming the first part and the second part by using a gray mask. The gray mask includes a first mask portion corresponding to the first part and a second mask portion corresponding to the second part, and a light transmittance of the first mask portion is different from that of the second mask portion.

For example, when the material of the organic insulating layer is a photoresist material, the organic insulating material layer formed on a whole surface can be directly exposed and developed to form the patterned, organic insulating layer. Alternatively, when the material of the organic insulating layer is a non-photoresist material, the organic insulating material layer formed on a whole surface can be exposed and developed to form a photoresist pattern thereon, and then the organic insulating material layer can be etched with the photoresist pattern as a mask so as to form the patterned organic insulating layer.

Hereinafter, the manner of forming the organic insulating layer will be described in details with reference to the case where the material of the organic insulating layer is a photoresist material by way of example.

For example, in some embodiments, the material of the organic insulating layer is a negative photoresist material such as acrylic resin. At this time, the unexposed part of the organic insulating material layer can be removed by development, while the exposed part can be retained. In some other embodiments, the material of the organic insulating layer is a positive photoresist material such as polyimide. At this time, the exposed part of the organic insulating material layer can be removed by development, while the unexposed part can be retained.

Figure 11A:
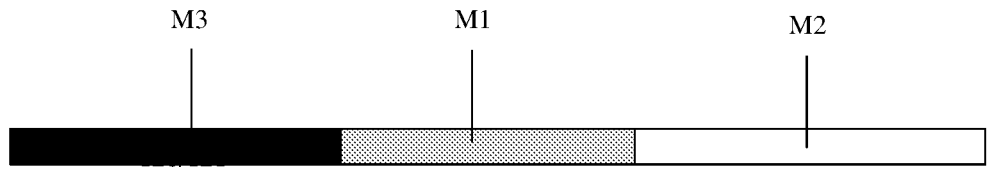
FIGS. 11A and 11B are schematic diagrams of manufacturing an organic insulating layer of a display panel provided by at least one embodiment of the present disclosure.
Figure 11A:
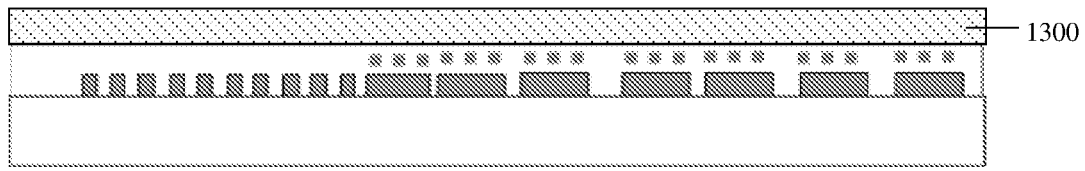
Figure 11B:
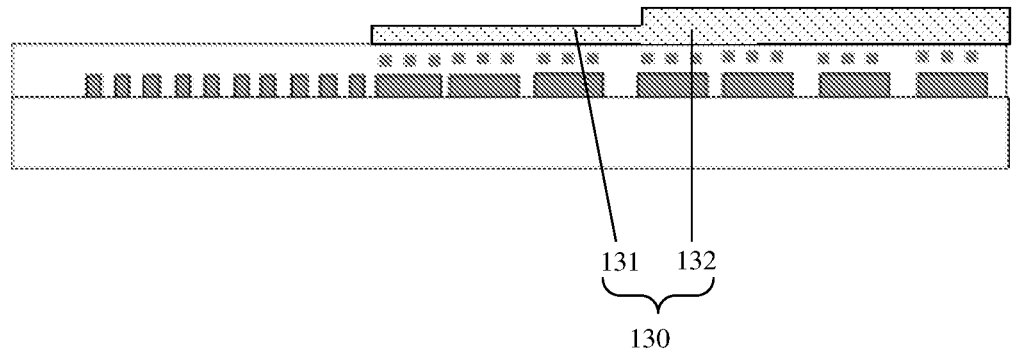

For example, FIGS. 11A and 11B illustrate the manufacturing process of the organic insulating layer shown in FIG. 5. As shown in FIGS. 11A and 11B, the first part 131 and the second part 132 are formed by using a gray mask, which includes a first mask portion M1 corresponding to the first part 131 and a second mask portion M2 corresponding to the second part 132. The light transmittance of the first mask portion M1 is different from that of the second mask portion M2.

For example, when the material of the organic insulating layer is a negative photoresist material such as acrylic resin, the first mask portion M1 is semi-transparent and the second mask portion M2 is completely transparent (light transmissive). In addition, the gray mask also includes a third mask portion M3 except the first mask portion M1 and the second mask portion M2, and the third mask portion M3 is opaque. For example, in some other embodiments, when the material of the organic insulating layer is a positive photoresist material such as polyimide, the first mask portion M1 is semi-transparent, the second mask portion M2 is opaque, and the third mask portion M3 is completely transparent.

As shown in FIG. 11A, after the driving circuit of the array substrate is formed, an organic insulating material layer 1300 is formed on the driving circuit, then the organic insulating material layer 1300 is exposed by using the gray mask and then is developed. As shown in FIG. 11B, after the development, the part of the organic insulating material layer 1300 corresponding to the third mask portion M3 is completely removed, the part of the organic insulating material layer 1300 corresponding to the first mask portion M1 is partially removed, while the part of the organic insulating material layer 1300 corresponding to the second mask portion M2 is not removed, that is, completely retained. In the organic insulating layer 130 formed as such, the average thickness of the first part 131 is smaller than that of the second part 132.

Figure 12A:
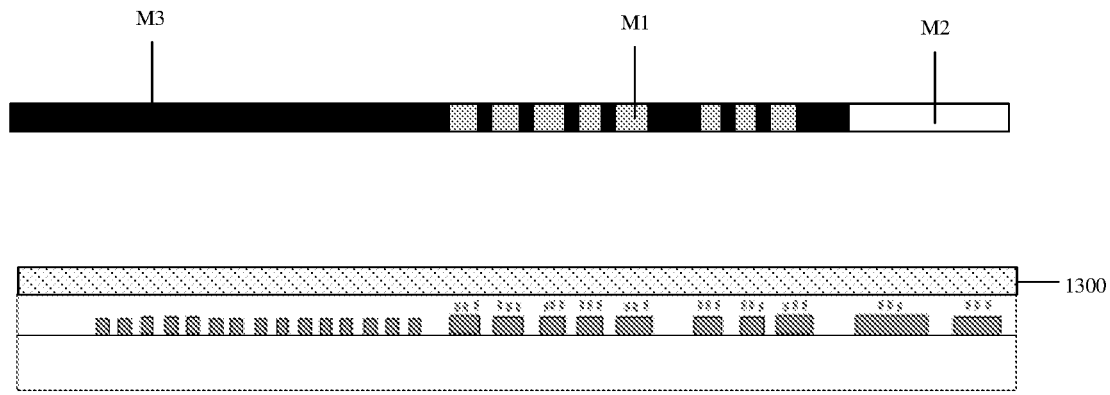
FIGS. 12A and 12B are some other schematic diagrams of manufacturing an organic insulating layer of a display panel provided by at least one embodiment of the present disclosure.
Figure 12B:
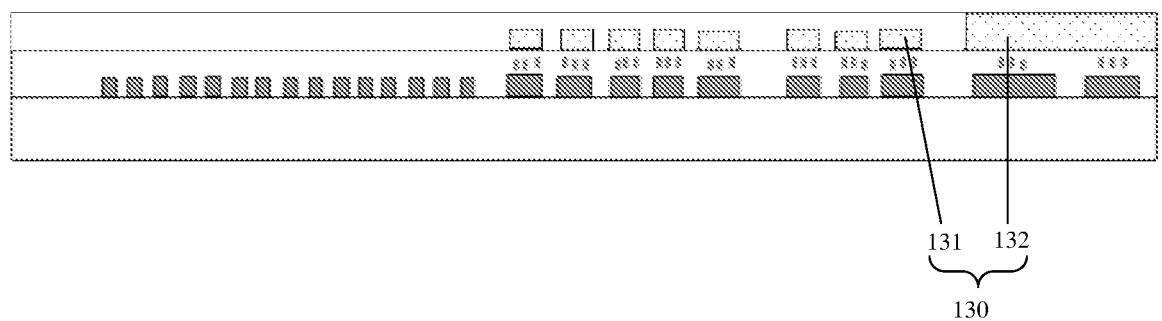

For example, FIGS. 12A and 12B illustrate the manufacturing process of the organic insulating layer shown in FIG. 7. In this example, the average thickness of the first part is smaller than the average thickness of the second part in the direction perpendicular to the substrate surface of the base substrate; and the first part includes an organic insulating pattern overlapped with the plurality of active devices of the gate scan driving circuit and a hollow portion having no overlap with the plurality of active devices of the gate scan driving circuit.

Figure 13:
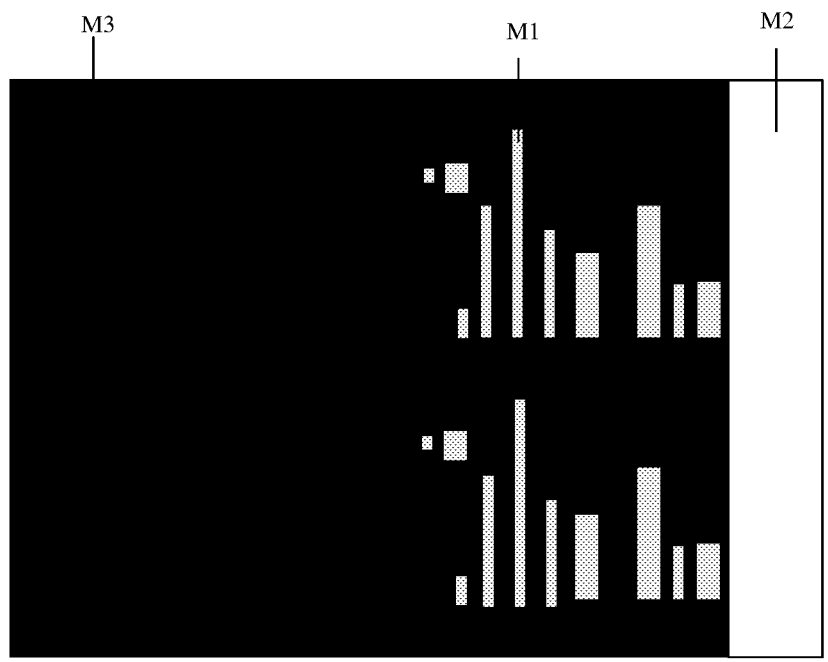
FIG. 13 is a schematic diagram of a mask for manufacturing an organic insulating layer of a display panel provided by at least one embodiment of the present disclosure.

As shown in FIGS. 12A and 12B, the first part 131 and the second part 132 are formed by using a gray mask. FIG. 13 shows a schematic plan view of the gray mask. As shown in FIGS. 12A, 12B and 13, the gray mask includes a first mask portion M1 corresponding to the organic insulating pattern of the first part 131, a second mask portion M2 corresponding to the hollow portion of the first part 131, and a third mask portion M3 corresponding to the second part. The third mask portion M3 also corresponds to, for example, other parts of the organic insulating layer that need to be removed.

For example, when the material of the organic insulating layer is a negative photoresist material such as acrylic resin, the first mask portion M1 is semi-transparent, the second mask portion M2 is completely transparent, and the third mask portion M3 is opaque. For example, in some other embodiments, when the material of the organic insulating layer is a positive photoresist material such as polyimide, the first mask portion M1 is semi-transparent, the second mask portion M2 is opaque, and the third mask portion M3 is completely transparent.

As shown in FIG. 12A, after the driving circuit of the array substrate is formed, an organic insulating material layer 1300 is formed on the driving circuit, then the organic insulating material layer 1300 is exposed by using the gray mask and then is developed. As shown in FIG. 12B, after development, the part of the organic insulating material layer 1300 corresponding to the third mask portion M3 is completely removed, the part of the organic insulating material layer 1300 corresponding to the first mask portion M1 is partially removed, while the part of the organic insulating material layer 1300 corresponding to the second mask portion M2 is not removed, that is, completely retained. In the organic insulating layer 130 formed as such, the average thickness of the first part 131 is smaller than that of the second part 132; and the first part 131 includes an organic insulating pattern overlapped with the plurality of active devices of the gate scan driving circuit and a hollow portion having no overlap with the plurality of active devices of the gate scan driving circuit.

Figure 14:
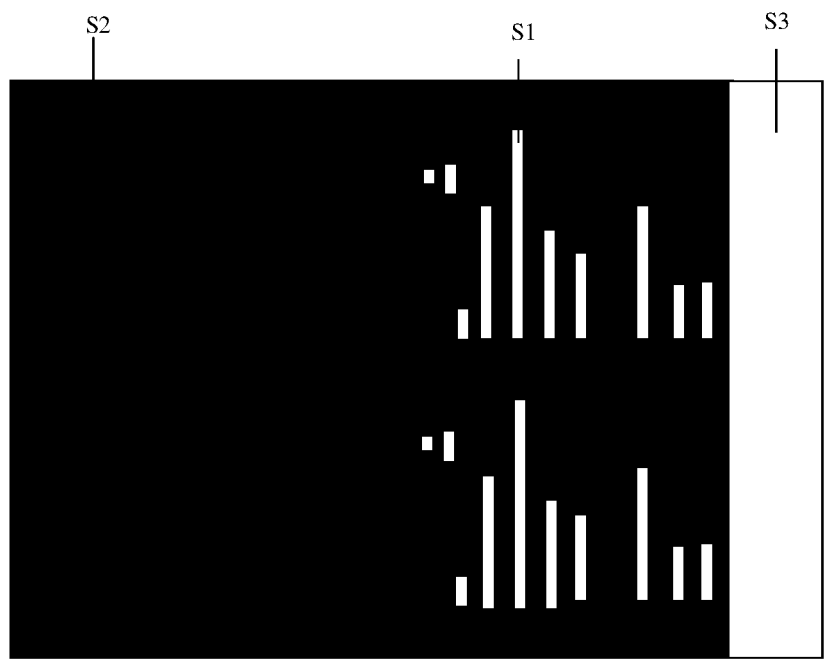
FIG. 14 is a schematic diagram of another mask for manufacturing an organic insulating layer of a display panel provided by at least one embodiment of the present disclosure.

For example, in some other embodiments, a slit mask can also be used to form the organic insulating layer as shown in FIG. 7. For example, FIG. 14 shows a schematic plan view of the slit mask. As shown in FIG. 14, the slit mask includes a slit portion S1 corresponding to the organic insulating pattern of the first part 131, a first mask portion S2 corresponding to the hollow portion of the first part 131, and a second mask portion S3 corresponding to the second part 132. The slit portion S1 includes a plurality of slits, and a width of each of the slits is smaller than a resolution limit of an exposure machine for exposing, so that the diffraction effect of light is utilized to realize the effect of semi-exposure. One of the first mask portion S2 and the second mask portion S3 is transparent, and the other is opaque.

For example, when the material of the organic insulating layer is a negative photoresist material such as acrylic resin, the first mask portion S2 is opaque and the second mask portion S3 is transparent. For example, in some other embodiments, when the material of the organic insulating layer is a positive photoresist material such as polyimide, the first mask portion S2 is transparent and the second mask portion S3 is opaque.

For example, after the organic insulating layer 130 is formed, other structures such as the first driving electrode and the second driving electrode may be formed on the array substrate, which is not limited in the embodiment of the present disclosure.

For example, after the array substrate and the opposite substrate are formed, a sealant layer is formed between the array substrate and the opposite substrate to bond the array substrate with the opposite substrate, and liquid crystal materials are injected between the array substrate and the opposite substrate to form a liquid crystal layer.

For example, the manufacturing method of the present disclosure may also include other processes such as attaching polarizers on the array substrate and the opposite substrate. These processes can be referred to related technologies, and will not be repeated in the embodiments of the present disclosure.

The following points need to be explained:

(1) The drawings of the embodiments of the present disclosure only refer to the structures related to the disclosed embodiments, and other structures can refer to the general design.

(2) For the sake of clarity, in the drawings used to describe the embodiments of the present disclosure, the thickness of layers or areas is exaggerated or reduced, that is, these drawings are not drawn to actual scale. It can be understood that when an element such as a layer, film, region or substrate is said to be located "above" or "below" another element, the element may be located "directly" above or below another element or there may be intervening elements.

(3) Without conflict, the embodiments of the present disclosure and the features in the embodiments can be combined with each other to obtain new embodiment(s).

The above are merely specific embodiments of the present disclosure, but the scope of protection of the present disclosure is not limited to this. The scope of protection of the present disclosure should be subject to the scope of protection of the claims.

What is claimed is:

1. A display panel having a display area and a peripheral area surrounding the display area, the display panel comprising an array substrate, an opposite substrate and a sealant layer between the array substrate and the opposite substrate to seal a periphery of the array substrate and a periphery of the opposite substrate, wherein
   the sealant layer is arranged in the peripheral area, and the sealant layer has a first edge close to the display area and a second edge away from the display area,
   the array substrate comprises a base substrate, a driving circuit arranged on the base substrate, and an organic insulating layer arranged at a side of the driving circuit away from the base substrate,
   the organic insulating layer comprises a first part and a second part, wherein the first part overlaps with the sealant layer in a direction perpendicular to a substrate surface of the base substrate, the second part has no overlap with the sealant layer, and an edge of the first part away from the display area is located between the first edge and the second edge in a direction parallel to the substrate surface of the base substrate, and
   the driving circuit comprises a gate scan driving circuit arranged in the peripheral area, and the gate scan driving circuit at least partially overlaps with the first part in the direction perpendicular to the substrate surface of the base substrate,
   the gate scan driving circuit comprises a plurality of active devices, and orthographic projections of the plurality of active devices on a plane of the organic insulating layer is located inside the organic insulating layer,
   in the direction perpendicular to the substrate surface of the base substrate, the first part comprises an organic insulating pattern overlapped with the plurality of active devices of the gate scan driving circuit and a hollow portion having no overlap with the plurality of active devices of the gate scan driving circuit,
   the organic insulating pattern overlapped with the plurality of active devices of the gate scan driving circuit comprises a plurality of portions spaced apart from each other, and the plurality of portions overlap with the plurality of active devices, in a one-to-one correspondence, in the direction perpendicular to the substrate surface of the base substrate, and
   the plurality of active devices comprise a plurality of thin film transistors, and the plurality of thin film transistors comprise a plurality of active layers, and orthographic projections of the plurality of active layers on the base substrate are located within orthographic projections of the plurality of portions on the base substrate.

2. The display panel according to claim 1, wherein in the direction parallel to the substrate surface of the base substrate, a distance between the edge of the first part away from the display area and the first edge is smaller than a distance between the edge of the first part away from the display area and the second edge.

3. The display panel according to claim 1, wherein in the direction perpendicular to the substrate surface of the base substrate, an average thickness of the first part is less than or equal to an average thickness of the second part.

4. The display panel according to claim 1, wherein the first part and the second part are continuously arranged, and edges of cross sections of the first part and the second part away from the base substrate are in a stepped shape.

5. The display panel according to claim 1, wherein the array substrate further comprises a plurality of signal lines arranged at a side of the gate scan driving circuit away from the display area, in the direction perpendicular to the substrate surface of the base substrate, the plurality of signal lines have no overlap with the organic insulating layer, and the plurality of signal lines overlap with the sealant layer.

6. The display panel according to claim 5, wherein the driving circuit further comprises a pixel driving circuit arranged in the display area, the pixel driving circuit comprises a first thin film transistor, the first thin film transistor comprises a first gate electrode, a first active layer and a first source-drain electrode, the plurality of thin film transistors comprise a second thin film transistor, and the second thin film transistor comprises a second gate electrode, a second active layer and a second source-drain electrode, and the first gate electrode and the second gate electrode are arranged in a same layer, the first active layer and the second active layer are arranged in a same layer, and the first source-drain electrode and the second source-drain electrode are arranged in a same layer.

7. The display panel according to claim 6, wherein the plurality of signal lines are respectively arranged in the same layer as the first gate electrode and the second gate electrode.

8. The display panel according to claim 6, wherein the array substrate further comprises a first planarization layer arranged at a side of the pixel driving circuit away from the base substrate, and the organic insulating layer comprises the first planarization layer.

9. The display panel according to claim 8, wherein the array substrate further comprises a first driving electrode arranged at a side of the first planarization layer away from the base substrate and a second planarization layer arranged at a side of the first driving electrode away from the base substrate, and the organic insulating layer further comprises the second planarization layer.

10. The display panel according to claim 9, wherein the display panel further comprises a second driving electrode arranged on the array substrate, and the second driving electrode is arranged in the same layer with the first driving electrode and is spaced apart from the first driving electrode, or, the second driving electrode is arranged in a different layer from that of the first driving electrode and is spaced apart from the first driving electrode; or the second driving electrode is arranged on the opposite substrate.

11. The display panel according to claim 1, wherein the array substrate further comprises a passivation layer arranged between the driving circuit and the organic insulating layer, and the opposite substrate further comprises a black matrix layer comprising a plurality of pixel openings, and the sealant layer is in direct contact with the black matrix layer and the passivation layer.

12. The display panel according to claim 1, wherein a distance between the first edge and the second edge is 0.1 mm to 1.5 mm.

13. A method of manufacturing a display panel having a display area and a peripheral area surrounding the display area, the method comprising:

providing an array substrate, wherein the array substrate comprises a base substrate, a driving circuit arranged on the base substrate, and an organic insulating layer arranged at a side of the driving circuit away from the base substrate, and wherein the organic insulating layer comprises a first part and a second part;

providing an opposite substrate; and forming a sealant layer between the array substrate and the opposite substrate to bond the array substrate with the opposite substrate, wherein the sealant layer is formed in the peripheral area, and the sealant layer has a first edge close to the display area and a second edge away from the display area, in a direction perpendicular to a substrate surface of the base substrate, the first part overlaps with the sealant layer, and the second part has no overlap with the sealant layer; and in a direction parallel to the substrate surface of the base substrate, an edge of the first part away from the display area is located between the first edge and the second edge, and the driving circuit comprises a gate scan driving circuit arranged in the peripheral area, and the gate scan driving circuit at least partially overlaps with the first part in the direction perpendicular to the substrate surface of the base substrate, the gate scan driving circuit comprises a plurality of active devices, and orthographic projections of the plurality of active devices on a plane of the organic insulating layer is located inside the organic insulating layer, in the direction perpendicular to the substrate surface of the base substrate, the first part comprises an organic insulating pattern overlapped with the plurality of active devices of the gate scan driving circuit and a hollow portion having no overlap with the plurality of active devices of the gate scan driving circuit, the organic insulating pattern overlapped with the plurality of active devices of the gate scan driving circuit comprises a plurality of portions spaced apart from each other, and the plurality of portions overlap with the plurality of active devices, in a one-to-one correspondence, in the direction perpendicular to the substrate surface of the base substrate, and the plurality of active devices comprise a plurality of thin film transistors, and the plurality of thin film transistors comprise a plurality of active layers, and orthographic projections of the plurality of active layers on the base substrate are located within orthographic projections of the plurality of portions on the base substrate.

14. The method according to claim 13, wherein an average thickness of the first part is smaller than an average thickness of the second part in the direction perpendicular to the substrate surface of the base substrate, wherein forming the first part and the second part comprises:

forming the first part and the second part by using a gray mask, wherein the gray mask comprises a first mask portion corresponding to the first part and a second mask portion corresponding to the second part, and a light transmittance of the first mask portion is different from that of the second mask portion.

15. The method according to claim 13, wherein in the direction perpendicular to the substrate surface of the base substrate, an average thickness of the first part is smaller than an average thickness of the second part, and the first part comprises an organic insulating pattern overlapped with a plurality of active devices of the gate scan driving circuit and a hollow portion having no overlap with the plurality of active devices of the gate scan driving circuit, wherein forming the first part and the second part comprises:

forming the first part and the second part by using a gray mask, wherein the gray mask comprises a first mask portion corresponding to the organic insulating pattern of the first part, a second mask portion corresponding to the hollow portion of the first part, and a third mask portion corresponding to the second part, and light transmittances of the first mask portion, the second mask portion and the third mask portion are different from each other.

16. The method according to claim 13, wherein in the direction perpendicular to the substrate surface of the base substrate, an average thickness of the first part is smaller than an average thickness of the second part, and the first part comprises an organic insulating pattern overlapped with a plurality of active devices of the gate scan driving circuit and a hollow portion having no overlap with the plurality of active devices of the gate scan driving circuit, wherein forming the first part and the second part comprises:

forming the first part and the second part by using a slit mask, wherein the slit mask comprises a slit portion corresponding to the organic insulating pattern of the first part, a first mask portion corresponding to the hollow portion of the first part and a second mask portion corresponding to the second part, and one of the first mask portion and the second mask portion is light transmissive and the other is light opaque.

* * * * *